United States Patent
Ku et al.

(10) Patent No.: US 9,316,685 B2
(45) Date of Patent: Apr. 19, 2016

(54) PROBE CARD OF LOW POWER LOSS

(71) Applicant: MPI CORPORATION, Hsinchu County (TW)

(72) Inventors: Wei-Cheng Ku, Hsinchu (TW); Jun-Liang Lai, Hsinchu (TW)

(73) Assignee: MPI CORPORATION, Hsinchu County (TW)

( * ) Notice: Subject to any disclaimer, the term of this patent is extended or adjusted under 35 U.S.C. 154(b) by 87 days.

(21) Appl. No.: 14/076,379

(22) Filed: Nov. 11, 2013

(65) Prior Publication Data

US 2014/0232421 A1 Aug. 21, 2014

(30) Foreign Application Priority Data

Nov. 12, 2012 (TW) .............................. 101142062 A
Nov. 11, 2013 (TW) .............................. 102140865 A

(51) Int. Cl.
*G01R 31/00* (2006.01)
*G01R 31/28* (2006.01)
*G01R 31/317* (2006.01)

(52) U.S. Cl.
CPC ...... *G01R 31/2889* (2013.01); *G01R 31/31721* (2013.01)

(58) Field of Classification Search
CPC ...................... G01R 31/2889; G01R 31/31721
USPC ............ 324/750.01, 750.24, 754.01, 754.03, 324/754.07, 756.03
See application file for complete search history.

(56) References Cited

U.S. PATENT DOCUMENTS

| | | | | |
|---|---|---|---|---|
| 6,218,848 B1 * | 4/2001 | Hembree | ........... | G01R 1/06744 324/754.05 |
| 6,337,577 B1 * | 1/2002 | Doherty | ............ | G01R 1/07385 324/754.08 |
| 6,356,098 B1 * | 3/2002 | Akram | ............... | G01R 31/2886 324/750.19 |
| 6,677,776 B2 * | 1/2004 | Akram | .................... | H01L 24/97 324/750.25 |
| 6,734,691 B2 * | 5/2004 | Saijyo | ................ | G01R 31/2886 324/756.03 |
| 6,798,225 B2 * | 9/2004 | Miller | ................ | G01R 1/07378 324/756.03 |
| 6,812,718 B1 * | 11/2004 | Chong | ............... | G01R 1/07342 324/754.07 |
| 6,946,866 B2 * | 9/2005 | Thurairajaratnam | | G01R 31/2886 324/534 |
| 7,043,389 B2 * | 5/2006 | Plusquellic | ........ | G01R 31/3004 438/106 |
| 7,046,027 B2 * | 5/2006 | Conner | ............. | G01R 1/07342 324/73.1 |

(Continued)

*Primary Examiner* — Jermele M Hollington
*Assistant Examiner* — Sean Curtis
(74) *Attorney, Agent, or Firm* — Ming Chow; Sinorica, LLC

(57) ABSTRACT

A probe card, which is used to transmit power signals and test signals from a tester to a DUT, includes a pin base, a plurality of signal pins, a signal conducting circuit and at least one power conducting circuit. The signal pins are made of conductive materials, and each contacts the DUT with an end thereof; the signal conducting circuit has a first resistance, and electrically connects the tester and the other end of one of the signal pin to transmit the test signals to the DUT; the power conducting circuit has a second resistance which is much less than the first resistance, and electrically connects the tester and the other end of one of the signal pin which is not connected with the signal conducting circuit to transmit the power signals to the DUT.

16 Claims, 8 Drawing Sheets

(56) References Cited

U.S. PATENT DOCUMENTS

| | | | | |
|---|---|---|---|---|
| 7,116,124 B2* | 10/2006 | Byrd | G01R 1/06766 | 324/750.05 |
| 7,199,460 B2* | 4/2007 | Shigeta | H01L 23/50 | 257/690 |
| 7,245,139 B2* | 7/2007 | Miller | G01R 1/07378 | 324/756.03 |
| 7,557,592 B2* | 7/2009 | Miller | G01R 31/2889 | 324/756.03 |
| 7,579,848 B2* | 8/2009 | Bottoms | G01R 1/0483 | 324/756.03 |
| 7,621,761 B2* | 11/2009 | Mok | C23C 18/00 | 439/66 |
| 7,667,474 B2* | 2/2010 | Sunohara | G01R 31/2875 | 324/750.06 |
| 8,159,245 B2* | 4/2012 | Komatsu | G01R 1/0408 | 324/754.01 |
| 8,531,202 B2* | 9/2013 | Mok | G01R 31/2889 | 324/762.03 |
| 8,542,027 B2* | 9/2013 | Chou | G01R 31/31905 | 324/754.01 |
| 8,841,931 B2* | 9/2014 | Kuo | G01R 1/07378 | 324/754.07 |
| 8,878,560 B2* | 11/2014 | Kuo | G01R 1/06772 | 29/593 |
| 2007/0069745 A1* | 3/2007 | Lou | G01R 1/06711 | 324/754.07 |
| 2008/0100319 A1* | 5/2008 | Aghababazadeh | G01R 31/2831 | 324/754.03 |
| 2008/0278185 A1* | 11/2008 | Chen | G01R 3/00 | 324/754.07 |
| 2010/0213960 A1* | 8/2010 | Mok | G01R 35/00 | 324/762.03 |
| 2010/0237886 A1* | 9/2010 | Chou | G01R 31/31905 | 324/755.01 |
| 2011/0121852 A1* | 5/2011 | Horii | G01R 31/2889 | 324/756.03 |
| 2012/0169367 A1* | 7/2012 | Kuo | G01R 1/06772 | 324/756.03 |
| 2013/0257564 A1* | 10/2013 | Huang | H01L 23/49827 | 333/177 |
| 2014/0028342 A1* | 1/2014 | Brandorff | G01R 31/2886 | 324/756.03 |

* cited by examiner

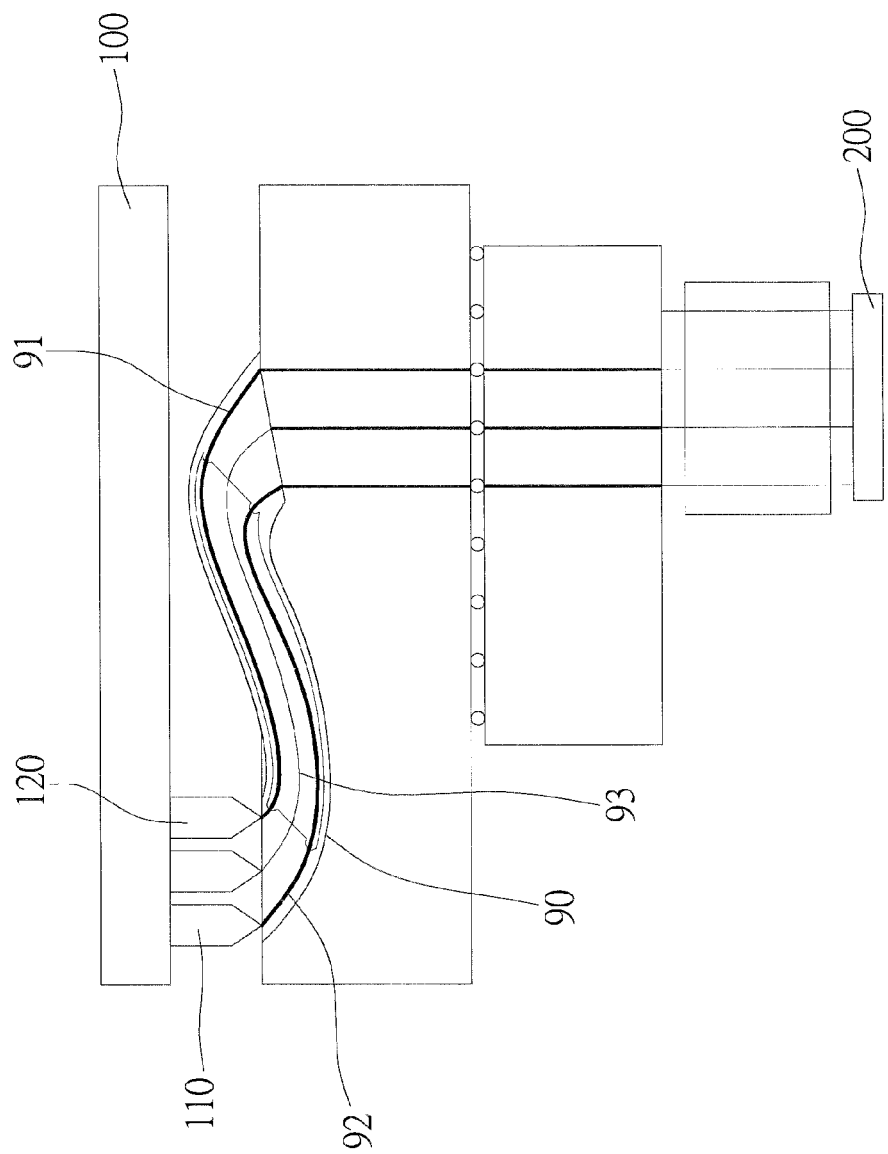

PROBE CARD OF LOW POWER LOSS

The current application claims foreign priorities to the patent applications of Taiwan No. 101142062 filed on Nov. 12, 2012 and No. 102140865 filed on Nov. 11, 2013.

BACKGROUND OF THE INVENTION

1. Technical Field

The present invention relates generally to a probe card, and more particularly to a probe card with low power loss.

2. Description of Related Art

Probe card is widely utilized as an interface between a tester and a device under test (DUT) to transmit test signals and power signals, which is a common way to detect if every electrical component of the DUT is electrically connected correctly. In such cases, the tester usually sends high-frequency power signals to the DUT to provide power as required.

However, on a conventional probe card, a conducting circuit for the power signals and another conducting circuit for the test signals should have the same resistances. As a result, when the tester transmits the high-frequency power signals to the probe card, the conducting circuit for power signals will generate a high resistance, which attenuates the power signals to a certain extent. Therefore, the DUT tends to stop operating due to insufficient power supply, or misjudge the test signals.

BRIEF SUMMARY OF THE INVENTION

In view of the above, the primary objective of the present invention is to provide a probe card with low power loss, which could transmit high-frequency power signals without greatly attenuating them.

The present invention provides a probe card with low power loss, which is used to transmit power signals and test signals from a tester to a device under test (DUT), wherein the tester provides power to the DUT via the power signals, and the DIT is electrically tested with the test signals. The probe card includes a plurality of signal pins, at least one signal conducting circuit, and at least one power conducting circuit. The signal pins are made of conductive materials, wherein each signal pin contacts the DUT with an end thereof. The at least one signal conducting circuit has a first resistance, wherein each signal conducting circuit electrically connects the tester and another end of one of the signal pins, and each signal conducting circuit is used to transmit the test signals to the DUT. The at least one power conducting circuit has a second resistance which is much less than the first resistance, wherein each power conducting circuit electrically connects the tester and another end of one of the signal pins which is not connected with the signal conducting circuit, and each power conducting circuit is used to transmit the power signals to the DUT.

Whereby, due to the low resistance of the aforesaid power conducting circuit, the probe card could transmit high-frequency power signals without greatly attenuating them.

BRIEF DESCRIPTION OF THE SEVERAL VIEWS OF THE DRAWINGS

The present invention will be best understood by referring to the following detailed description of some illustrative embodiments in conjunction with the accompanying drawings, in which

FIG. 8 is a sketch diagram of a third embodiment of the present invention.

DETAILED DESCRIPTION OF THE INVENTION

Figure 1:
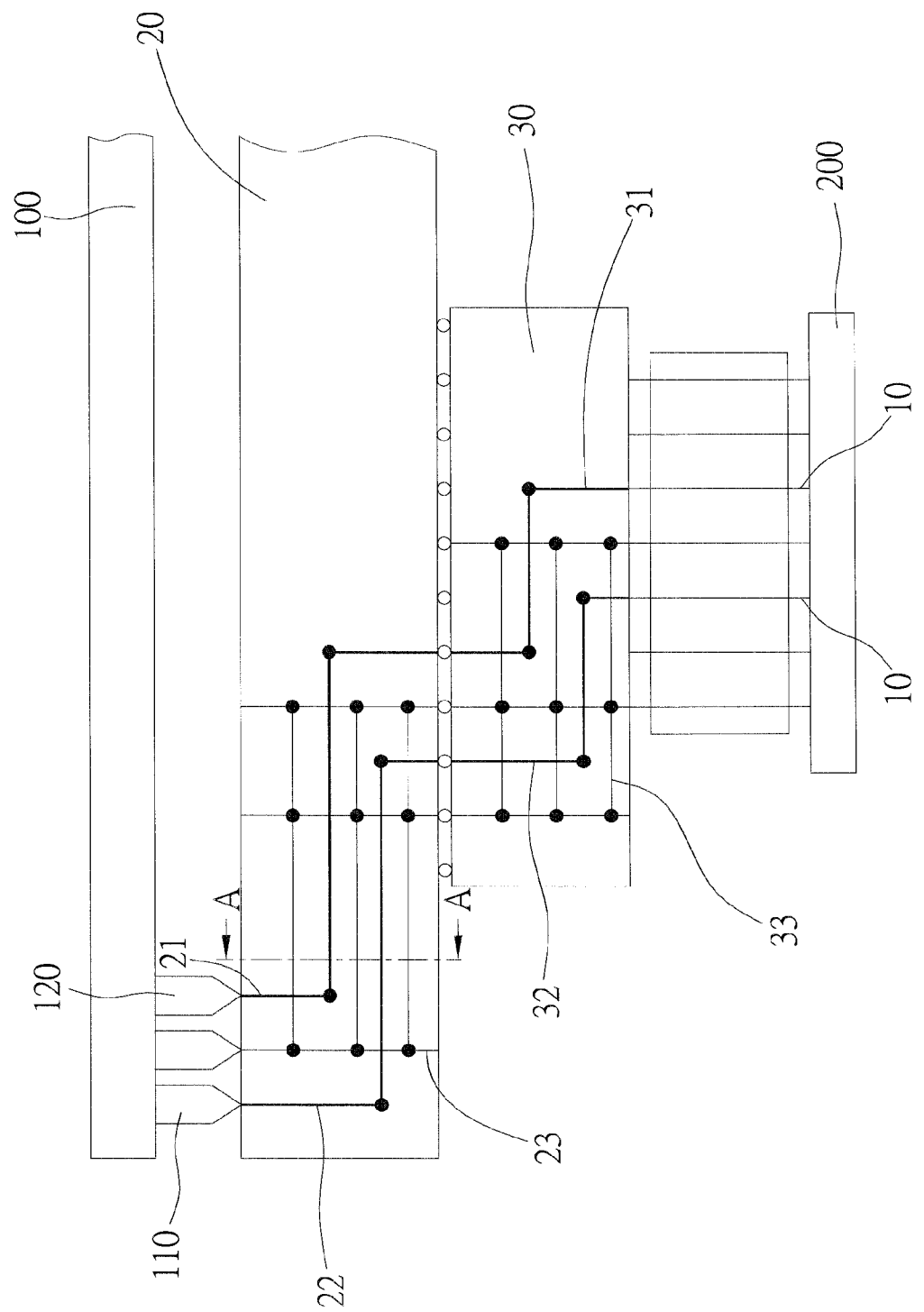
FIG. 1 is a sketch diagram of a first embodiment of the present invention.

As shown in FIG. 1, a probe card of the first embodiment of the present invention is used to transmit power signals and test signals, which are respectively sent from a power terminal 110 and a signal terminal 120 of a tester 100, to a device under test (DUT) 200. The tester 100 provides power to the DUT 200 via the power signals, and the DUT 200 is tested with the test signals. The probe card includes a plurality of signal pins 10, a substrate 20, and a carrier substrate 30.

The signal pins 10 are made of metal, and other conductive materials could be selected in other embodiments as well. One end of each signal pin 10 contacts a test portion or a power receiving portion of the DUT 200.

Figure 2:
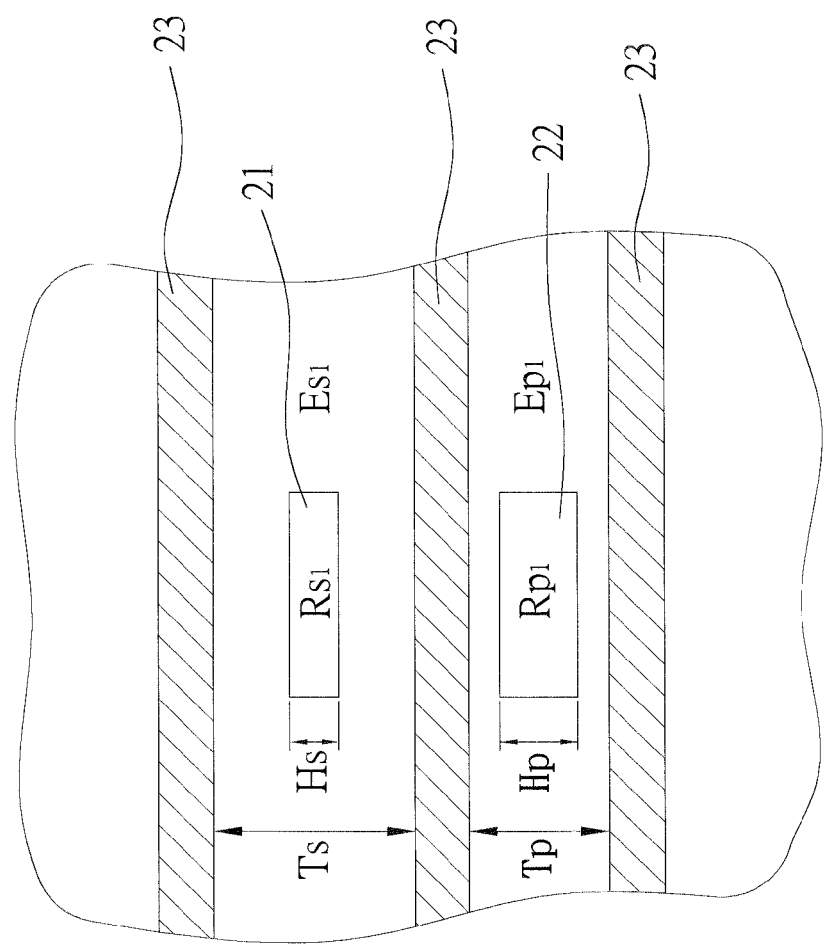
FIG. 2 is a sectional view along the A-A line of FIG. 1.

The substrate 20 has a side connected to the tester 100. In the present embodiment, the substrate 20 is a multi-layer printed circuit board, which has a first signal conductor 21, a first power conductor 22, and a plurality of first ground conductors 23 embedded therein. The first signal conductor 21, the first power conductor 22, and the first ground conductors 23 are made of conductive materials. The first signal conductor 21 is connected to the signal terminal 120, the first power conductor 22 is connected to the power terminal 110, and the first ground conductors 23 surround the first power conductor 22. As shown in FIG. 2, the first signal conductor 21 and the first power conductor 22 are designed with the following rules:

1. $R_{P1} \leq R_{S1}$;
2. $H_P \geq H_S$;
3. $E_{P1} \geq E_{S1}$;
4. $T_P \leq T_S$;
5. $H_P/T_P \geq H_S/T_S$;
6. $T_P - H_P \leq T_S - H_S$;

where $R_{P1}$ is a resistance coefficient of the first power conductor 22;

$R_{S1}$ is a resistance coefficient of the first signal conductor 21;

$H_P$ is a thickness of the first power conductor 22;

$H_S$ is a thickness of the first signal conductor 21;

$E_{P1}$ is a dielectric constant of a dielectric material of the substrate 20 around the first power conductor 22;

$E_{S1}$ is a dielectric constant of a dielectric material of the substrate 20 around the first signal conductor 21;

$T_P$ is a thickness of the dielectric material of the substrate 20 around the first power conductor 22; and $H_P$ is a thickness of the dielectric material of the substrate 20 around the first signal conductor 21.

With the low resistance coefficient and the large thickness of the first power conductor 22, its resistance could be very low, and much less than that of the first signal conductor 21. Furthermore, with the high dielectric constant of the first power conductor 22, it could have a higher capacitance, which makes the resistance thereof further lower while transmitting the power signals with high frequency.

The carrier substrate 30 is connected to another side of the substrate 20. In the preferred embodiment, the carrier substrate 30 is a multi-layer ceramic (MLC), which has a second signal conductor 31, a second power conductor 32, and a plurality of second ground conductors 33 embedded therein. The second signal conductor 31 has two ends respectively connected to the first signal conductor 21 and the signal pin 10, which contacts the test portion of the DUT 200. The second power conductor 32 has two ends respectively connected to the first power conductor 22 and the signal pin 100, which contacts the power receiving portion of the DUT 200. The second ground conductors 33 surround the first power conductor 32. In the preferred embodiment, the second signal conductor 31 and the second power conductor 32 are designed with the aforementioned limitations for the first signal conductor 21 and the first power conductor 32; therefore, a resistance of the second power conductor 32 is much less than that of the second signal conductor 31.

In this way, the first signal conductor 21 of the substrate 20 and the second signal conductor 31 of the carrier substrate 30 form a signal conducting circuit with a first resistance, which could transmit the test signals from the tester 100 to the DUT 200. Meanwhile, the first power conductor 22 of the substrate 20 and the second power conductor 32 of the carrier substrate 30 form a power conducting circuit with a second resistance which is much less than the first resistance, and the second resistance could transmit the high-frequency power signals from the tester 100 to the DUT 200. The second resistance is so low that the power signals would not be attenuated. As a result, the DUT 200 would neither stop operating due to insufficient power supply, nor misjudge the test signals.

Figure 3:
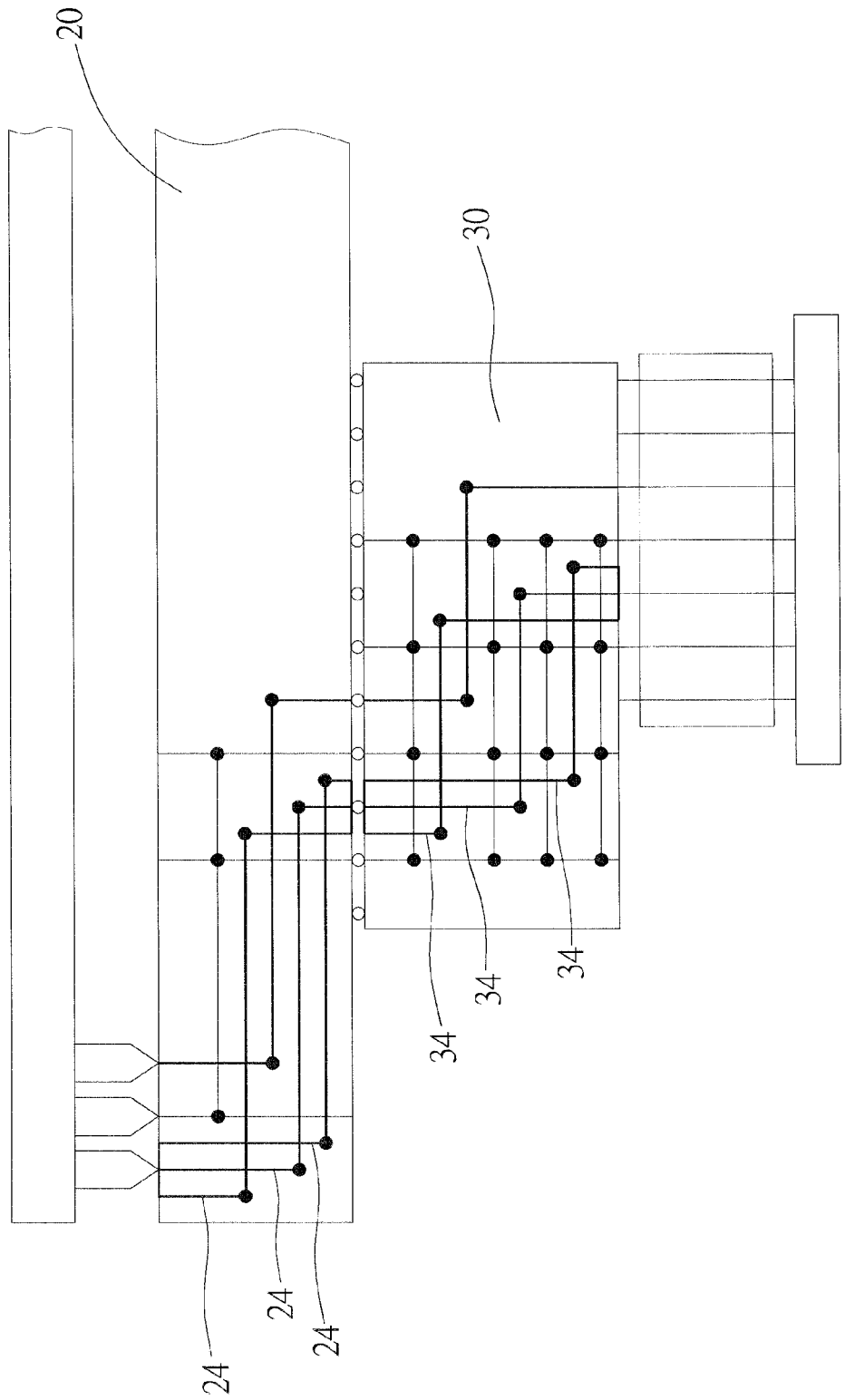
FIG. 3 is a sketch diagram of the first embodiment of the present invention, showing the alternate structure of the power conductors connected in parallel.

In an embodiment shown in FIG. 3, the substrate 20 has a plurality of first power conductors 24 which are connected in parallel, and the carrier substrate 30 has a plurality of second power conductors 34 which are connected in parallel too. The second resistance of the power conducting circuit could be even lower with such design. Needless to say, in practice, there could be only either the substrate 20 having the first power conductors 24 or the carrier substrate 30 having the second power conductors 34.

Figure 4:
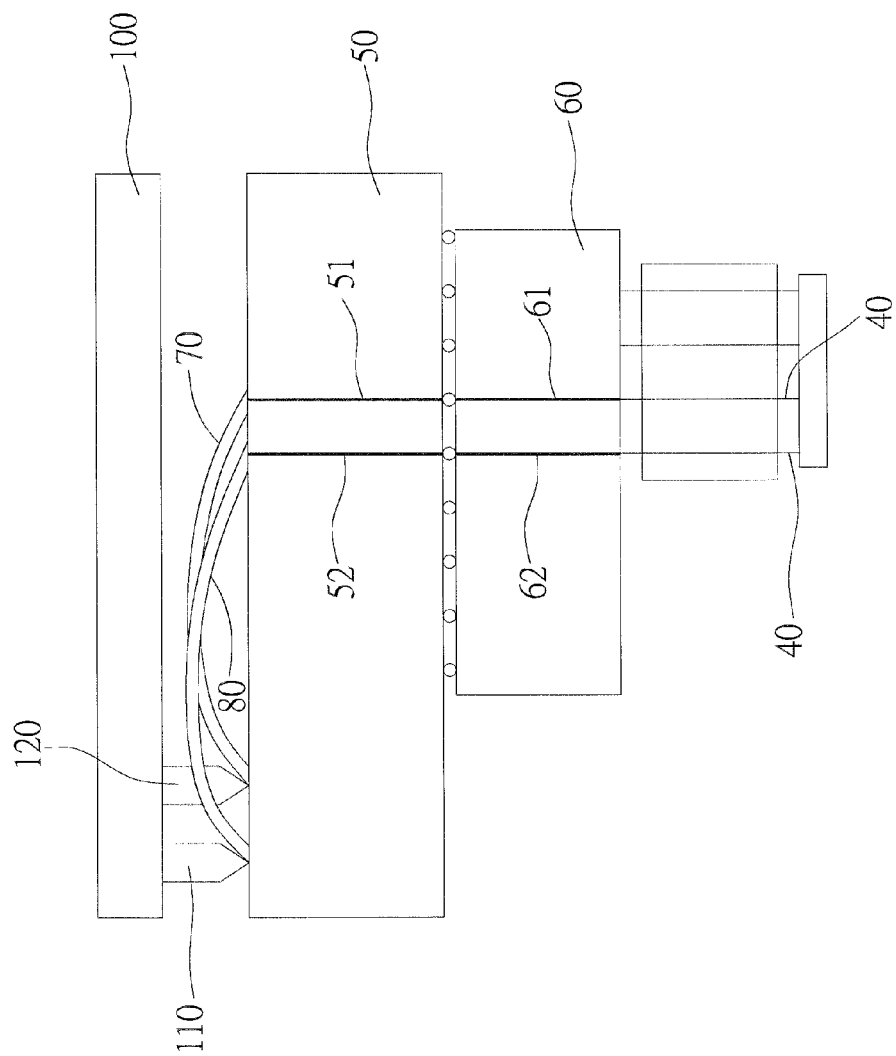
FIG. 4 is a sketch diagram of a second embodiment of the present invention.

Furthermore, a probe card of the second preferred embodiment shown in FIG. 4 includes a plurality of signal pins 40, a substrate 50, a carrier substrate 60, a signal coaxial cable 70, and a power coaxial cable 80. The second embodiment is basically the same as the first embodiment, except that the first signal conductor 51 and the first power conductor 52 are directly set through the substrate 50, and the second signal conductor 61 and the second power conductor 62 are directly set through the carrier substrate 60 too. In addition, the signal coaxial cable 70 is connected to the first signal conductor 51, and the power coaxial cable 80 is connected to the first power conductor 52.

Therefore, the signal conducting circuit for transmitting the test signals includes the signal coaxial cable 70, the first signal conductor 51 of the substrate 50, and the second signal conductor 61 of the carrier substrate 60. Since the first signal conductor 51 and the second signal conductor 61 are set through the substrate 50 and the carrier substrate 60 respectively, there would not be electric field effect generated in between to influence a resistance of the signal conducting circuit. In other words, the resistance of the signal conducting circuit is controlled and adjusted mainly depending on the design of the signal coaxial cable 70. In addition, the power conducting circuit for transmitting the power signals includes the power coaxial cable 80, the first power conductor 52 of the substrate 50, and the second power conductor 62 of the carrier substrate 60. Based on the same reason, a resistance of the power conducting circuit is controlled and adjusted mainly depending on the design of the power coaxial cable 80.

Figure 5A:
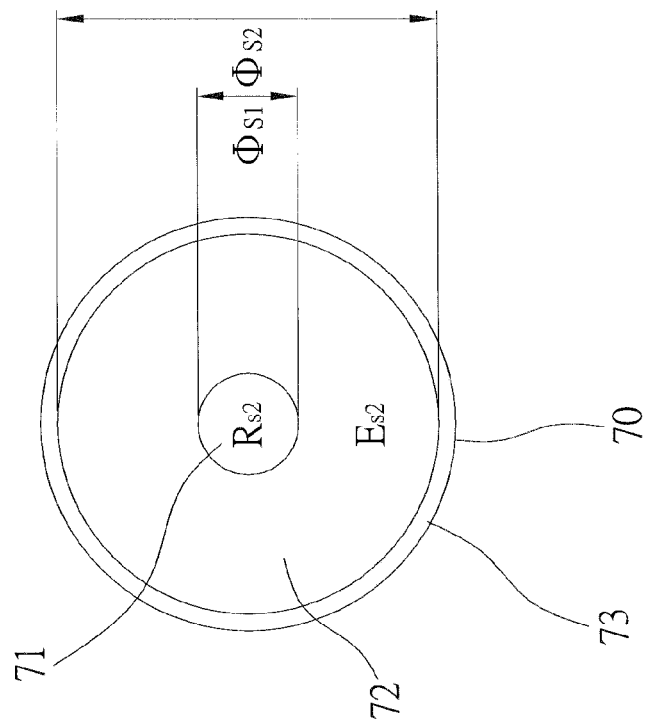
FIG. 5A is a sectional view of the signal coaxial cable of the second embodiment of the present invention.
Figure 5B:
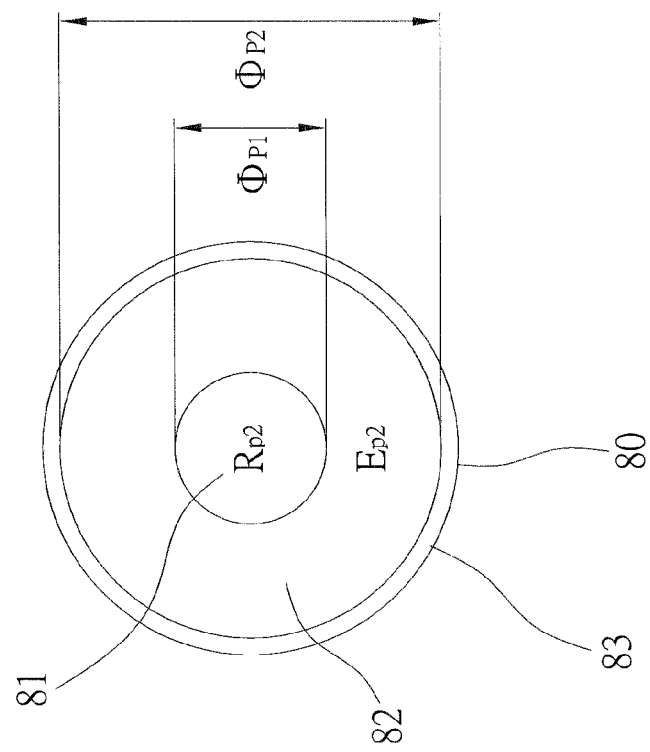
FIG. 5B is a sectional view of the power coaxial cable of the second embodiment of the present invention.

As shown in FIG. 5A and 5B, the coaxial cables 70 and 80 respectively include a signal line 71(81) at center, a dielectric layer 72(82) which coats the signal line 71(81), and a ground line 73(83) which coats the outside of the dielectric layer 72(82). In order to lower a resistance of the power coaxial cable 80 effectively, the signal coaxial cable 70 and the power coaxial cable 80 could be designed with the following rules:

1. $R_{P2} \leq R_{S2}$;
2. $E_{P2} \geq E_{S2}$;
3. $\Phi_{P1} \geq \Phi_{S1}$;
4. $\Phi_{P1} - \Phi_{P2} \leq \Phi_{S1} - \Phi_{S2}$;
5. $\Phi_{P1}/\Phi_{P2} \Phi_{S1}/\Phi_{S2}$;

where $R_{P2}$ is a resistance coefficient of the signal line 81 in the power coaxial cable 80;

$R_{S1}$ is a resistance coefficient of the signal line 71 in the signal coaxial cable 70;

$E_{P2}$ is a dielectric constant of the dielectric layer 82 in the power coaxial cable 80;

$E_{S1}$ is a dielectric constant of the dielectric layer 72 in the signal coaxial cable 70;

$\Phi_{P1}$ is a diameter of the signal line 81 in the power coaxial cable 80;

$\Phi_{S1}$ is a diameter of the signal line 71 in the signal coaxial cable 70;

$\Phi_{P2}$ is a diameter of the dielectric layer 82 in the power coaxial cable 80; and $\Phi_{S2}$ is a diameter of the dielectric layer 72 in the signal coaxial cable 70.

With the low resistance coefficient of the power coaxial cable 80, its resistance could be much less than that of the signal coaxial cable 70. With the high dielectric constant of the dielectric layer 82 and the specific ratio between the diameters of the signal line 81 and the dielectric layer 82, the power coaxial cable 80 could further has a higher capacitance, and therefore the resistance thereof could be even lowered while transmitting the power signals with high frequency. As a result, the power signals would not be greatly attenuated while being transmitted with high frequency from the tester 100 to the DUT 200.

Figure 6:
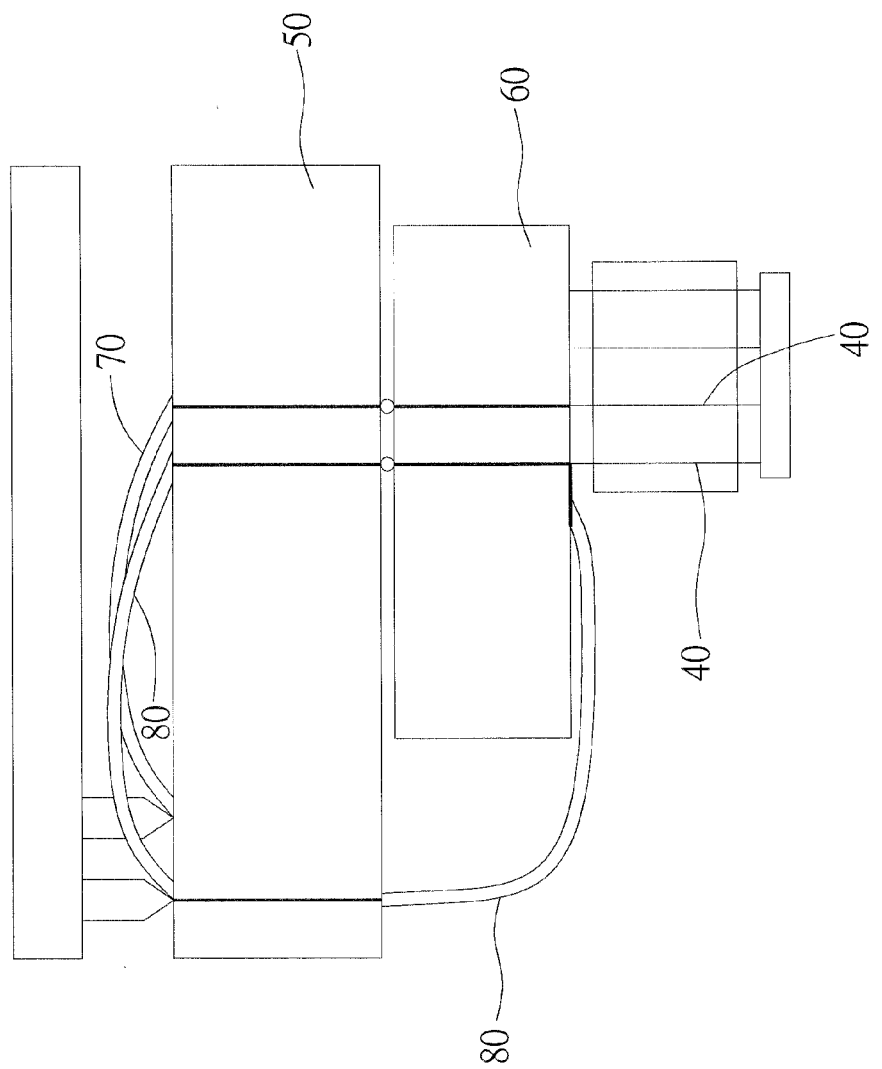
FIG. 6 is a sketch diagram of the second embodiment of the present invention, showing a structure of a plurality of power coaxial cables connected in parallel.
Figure 7:
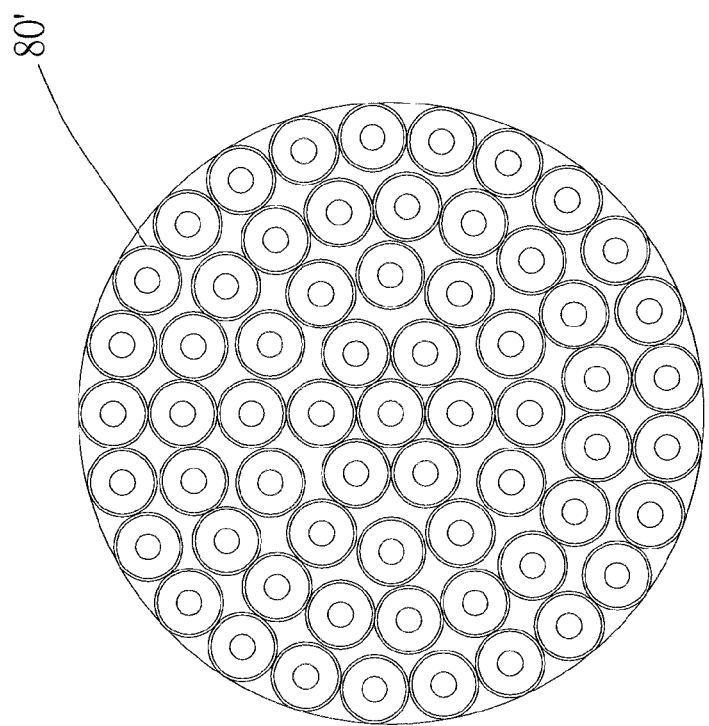
FIG. 7 is a sketch diagram of the second embodiment of the present invention, showing a structure of a multi-core cable made up by a plurality of power coaxial cables.

In an embodiment shown in FIG. 6, there are several power coaxial cables 80 connected in parallel. Yet in another embodiment shown in FIG. 7, the power coaxial cable 80 is geometrically shrunk to a power coaxial cable 80', and multiple power coaxial cables 80' are combined to make up a thicker multi-core cable, wherein the power coaxial cables 80' in the multi-core cable are connected in parallel. A resistance of the power conducting circuit could be further lowered with such design.

In the third embodiment shown in FIG. 8, a flexible printed circuit board 90 is incorporated to help transmitting the power signals and the test signals from the tester 100 to the DUT 200. Precisely, a substrate of the flexible printed circuit board 90 has a signal conductor 91, a power conductor 92, and a plurality of ground conductors 93 surrounding the power conductor 92, wherein the signal conductor 91, the power conductor 92 and the ground conductors 93 are provided as the first signal conductor 21, the first power conductor 32, and the first ground conductors 23. In this way, a resistance of a power conducting circuit formed by the power conductor 92 is much less than a resistance of a signal conducting circuit formed by the signal conductor 92, and therefore the power signals would not be greatly attenuated while being transmitted with high frequency from the tester 100 to the DUT 200. Of course, there could be multiple power conductors 92 connected in parallel in the substrate of the flexible printed circuit board 90 in practice, which further lowers the resistance of the power conducting circuit.

In an embodiment, the power conducting circuit is a multi-core strand which electrically connects the tester 100 and the corresponding signal pin 10, wherein the multi-core strand includes a plurality of power wires and a plurality of ground wires for transmitting the power signals forth and back. Furthermore, numbers of the power wires and numbers of the ground wires are at a ratio between 6:4 and 4:6, wherein a preferred ratio is 5:5. Of course, there could be several multi-core strands being connected in parallel in practice, which further lowers the resistance of the power conducting circuit.

Needless to say, depending on distances between the test portions of the DUT 200, there could be only the substrate 20, 50 being applied in practice. Furthermore, the power conductors 22, 32 in the first embodiment could be applied singly, or be connected in parallel with the power coaxial cable 80 in the second embodiment, or the multi-core cable (or the multi-core strand) formed by the power coaxial cables 80' in the third embodiment, to lower the resistance of the power conducting circuit.

It must be pointed out that the embodiments described above are only some preferred embodiments of the present invention. All equivalent structures and methods which employ the concepts disclosed in this specification and the appended claims should fall within the scope of the present invention.

What is claimed is:

1. A probe card for transmitting power signals and test signals from a tester to a device under test (DUT), wherein the tester provides power to the DUT via the power signals, and the DUT is tested with the test signals, the probe card comprising:
    a plurality of signal pins made of conductive materials, wherein each signal pin has two ends, and one of the two ends thereof contacts the DUT;
    at least one signal conducting circuit having a first resistance, wherein each signal conducting circuit electrically connects the tester and the other end of one of the signal pins, and each signal conducting circuit transmits the test signals to the DUT; and
    at least one power conducting circuit having a second resistance which is much less than the first resistance, wherein each power conducting circuit electrically connects the tester and the other end of one of the signal pins which is not connected with the signal conducting circuit, and each power conducting circuit transmits the power signals to the DUT.

2. The probe card of claim 1, further comprising a substrate connected to the tester, wherein the power conducting circuit further comprises at least one first power conductor which is provided in the substrate.

3. The probe card of claim 2, further comprising a carrier substrate connected to the substrate, wherein the power conducting circuit further comprises at least one second power conductor provided in the carrier substrate, and the second power conductor and the first power conductor are connected in series.

4. The probe card of claim 2, wherein the power conducting circuit further includes a plurality of first power conductors connected in parallel in the substrate.

5. The probe card of claim 3, wherein the power conducting circuit further includes a plurality of second power conductors connected in parallel in the carrier substrate.

6. The probe card of claim 1, wherein the power conducting circuit further includes at least one power coaxial cable which has two ends electrically connected to the tester and the corresponding signal pin respectively.

7. The probe card of claim 6, wherein the power conducting circuit further includes a plurality of power coaxial cables, which are connected to each other in parallel.

8. The probe card of claim 1, further comprising a substrate connected to the tester, wherein the signal conducting circuit further comprises a first signal conductor which is provided in the substrate.

9. The probe card of claim 8, further comprising a carrier substrate connected to the substrate, wherein the signal conducting circuit further comprises at least one second signal conductor provided in the carrier substrate, and the second signal conductor and the first signal conductor are connected in series.

10. The probe card of claim 1, wherein the signal conducting circuit further includes a signal coaxial cable which has two ends electrically connected to the tester and the corresponding signal pin respectively.

11. The probe card of claim 1, further comprising at least one flexible printed circuit board, wherein the power conducting circuit further comprises at least one power conductor, which is provided on the flexible printed circuit board.

12. The probe card of claim 11, wherein the power conducting circuit further includes a plurality of power conductors, which are connected in parallel on the flexible printed circuit board.

13. The probe card of claim 1, further comprising a flexible printed circuit board, wherein the signal conducting circuit further comprises a signal conductor, which is provided on the flexible printed circuit board.

14. The probe card of claim 1, wherein the power conducting circuit further includes at least one multi-core strand which has two ends electrically connected to the tester and the corresponding signal pin respectively.

15. The probe card of claim 14, wherein the power conducting circuit further includes a plurality of multi-core strands, which are connected to each other in parallel.

16. The probe card of claim 14, wherein the multi-core strand further includes a plurality of power wires and a plurality of ground wires, and numbers of the power wires and numbers of the ground wires are at a ratio between 6:4 and 4:6.

* * * * *